United States Patent [19]

Drehman et al.

[11] Patent Number: 5,376,626
[45] Date of Patent: Dec. 27, 1994

[54] MAGNETIC FIELD OPERATED SUPERCONDUCTOR SWITCH

[75] Inventors: Alvin J. Drehman, Chelmsford; Stephen Bachowski, Woburn, both of Mass.

[73] Assignee: The United States of America as represented by the Secretary of the Air Force, Washington, D.C.

[21] Appl. No.: 956,447

[22] Filed: Oct. 2, 1992

Related U.S. Application Data

[63] Continuation of Ser. No. 411,946, Sep. 25, 1989, abandoned.

[51] Int. Cl.$^5$ .................. H01L 39/00; H01L 39/16; H03K 17/92; H03K 3/38
[52] U.S. Cl. ................... 505/234; 505/150; 505/701; 505/778; 505/780; 505/782; 505/783; 505/860; 338/32 S; 335/216; 327/370; 327/527
[58] Field of Search .............. 338/32 S; 357/5; 505/1, 505/843, 780, 778, 782, 783, 862, 857, 881, 882, 856, 150, 160, 170, 162, 234, 701, 860; 257/31, 33, 34; 361/141; 174/15.4, 125.1; 330/62; 335/216; 307/245, 306, 277, 426, 476

[56] References Cited

U.S. PATENT DOCUMENTS

| | | | |
|---|---|---|---|
| 3,383,758 | 5/1968 | Bremer | 29/599 |
| 3,466,470 | 9/1969 | Rowell | 307/306 |
| 3,706,064 | 12/1972 | Dynes et al. | 338/32 S |
| 3,707,670 | 12/1972 | Erdman | 323/96 |
| 3,715,703 | 2/1973 | Croso et al. | 338/32 S |
| 3,764,828 | 10/1973 | Croso et al. | 307/245 |
| 3,956,727 | 5/1976 | Wolf | 338/32 S |
| 4,227,096 | 10/1980 | Holdeman et al. | 307/233 R |
| 4,334,158 | 6/1982 | Faris | 307/462 |
| 4,358,783 | 11/1982 | Hebard et al. | 357/5 |
| 4,588,947 | 5/1986 | Ketchen | 324/201 |
| 4,647,954 | 3/1987 | Graf et al. | 357/23.3 |

FOREIGN PATENT DOCUMENTS

| | | | |
|---|---|---|---|
| 1-015988 | 1/1989 | Japan . | |
| 64-46989 | 2/1989 | Japan . | |
| 1-137682 | 5/1989 | Japan | 357/5 |
| 1-137683 | 5/1989 | Japan | 357/5 |
| 1-140681 | 6/1989 | Japan | 357/5 |

OTHER PUBLICATIONS

Hidaka et al., "Anisotropic Properties of Superconducting Single-Crystal $(La_{1-x}Sr_x)_2CuO_4$" Apr. 4, 1987 *Japanese J. of Applied Physics*, L377-379.

Shelton et al., "Anisotropic Magnetization in Single Crystal $YBa_2Cu_3O_7$" Aug. 25, 1987 Beijins Int'l Topical Meeting on High-$T_c$ Superconductivity also in *Int. J. Mod. Phy.* pp. 1–4.

Gavaler et al. "Fabrication of High-$T_c$ Superconducting $YBa_2Cu_3O_7$ films" Apr. 14, 1988, Proc. MRS Spring Mtg.

*Primary Examiner*—William D. Larkins
*Assistant Examiner*—Alice W. Tang
*Attorney, Agent, or Firm*—Donald J. Singer; Stanton E. Collier

[57] ABSTRACT

A superconducting switch is composed of anisotropic magnetic material. The switch has a first superconducting section, a variable resistive section and a second superconducting section. An external magnetic field is applied so that the first and second superconducting sections remain superconducting and the resistive section changes resistance when the magnetic field applied exceeds the critical field of the variable resistance section. The different critical field regions are achieved by exploiting the natural critical field anisotropy of the ceramic superconductors (a previously unobserved phenomena in metal superconductors). By making the different sections with different orientations they will exhibit different critical field valves for a given direction of applied fields. The state of the switch is changed by either increasing or decreasing the external magnetic field about the critical field value of the resistive section of the switch. The first superconducting section is connected to the resistive section and the resistive section is connected to the second superconducting section to form a switch circuit. The change in the current flowing through the switch indicates the state of the switch.

3 Claims, 2 Drawing Sheets

MAGNETIC FIELD OPERATED SUPERCONDUCTOR SWITCH

STATEMENT OF GOVERNMENT INTEREST

The invention described herein may be manufactured and used by or for the Government for governmental purposes without the payment of any royalty thereon.

This application is a continuation of application Ser. No. 07/411,946, filed Sep. 25, 1989, now abandoned.

BACKGROUND OF THE INVENTION

The present invention relates to superconductor devices, and, in particular, to a superconducting switch.

It is known that, in order to cause a superconducting material to shift from the superconducting state to the normal-conducting state, either all or part of the circuit must be subjected to a magnetic field or to a temperature rise, the value which exceeds that of a given field or of a critical temperature. The material thus loses its superconducting properties and reverts to the normal state in which it has electrical resistance. Similarly, by restoring the conditions of field and temperature to their initial state, the material returns to its zero resistance state the same manner as a conventional arrangement which makes use of a mechanical switch or the like.

One type of superconducting switch is called a cryotron which comprises a gate-conductor film on the order of 0.3-1.0 micron thickness of soft superconductive material which is crossed by narrow control-conductor film also on the order of 0.3-1.0 micron thickness insulated therefrom and preferably formed of hard superconductive material. Both the gate-conductor and the control-conductor are thus normally in the superconducting state. If sufficient current is caused to flow through the control-conductor, the resulting magnetic field causes the gate-conductor to become resistive in the region of the crossover. See U.S. Pat. Nos. 3,383,758 and 3,706,064 which are incorporated by reference.

Other types of superconductor switches use an interface region between two superconducting regions. The interfacial region may be formed in a variety of geometries including a superconductor, insulator barrier, superconductor (SIS); superconductor, normal metal, superconductor (SNS), point contact and bridge type structures. The interfacial region in each of the above cases is a weak-link region interconnecting the superconductive regions, the weak-link is the thin insulator in the SIS structure, the thin normal metal in the SNS structure, the region of contact in the point contact structure and the region of minimum cross-sectional area in the bridge structure.

When the current through the interface exceeds a first critical current, $I_c$, the voltage across the interface increases to some finite value. This voltage does not return to zero until a switchback current is reached.

The switching in the above devices is magnetically controlled.

SUMMARY OF THE INVENTION

The present invention, a superconductor switch, is composed of three sections of superconductive material having an inner section of superconductive ceramic which has a lower critical field than the other two sections. This is achieved by exploiting the anisotropy of the critical field in the ceramic superconductors.

In the preferred embodiment a thin film of the superconductive materials are placed on an electrically insulative substrate to form a portion of an electrical circuit.

The switch is composed of a first superconductive section, a variable resistive section and a second superconductive section. The variable resistive section has either no resistance or a high value of resistance which depends on the level of the applied magnetic field in a predetermined direction.

The first and second superconductive sections are oriented such that the critical field therein, as determined by the field orientation, is the same. The variable resistive section is oriented such that the critical field therein is less than the critical field in the first and second superconducting sections. Therefore, as the magnetic field is increased above the critical field of the inner section and less than the critical field in the other sections, the inner, variable resistive, section will become resistive in nature thus acting like a switch, similar to the cryoton.

It is therefore one object of the present invention to provide a superconductor switch not having a Josephson junction therein.

It is another object of the present invention to provide a superconductor switch that is controlled by the direction of an applied magnetic field.

It is another object of the present invention to provide a superconductor switch that is controlled by an external magnetic field.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1A:
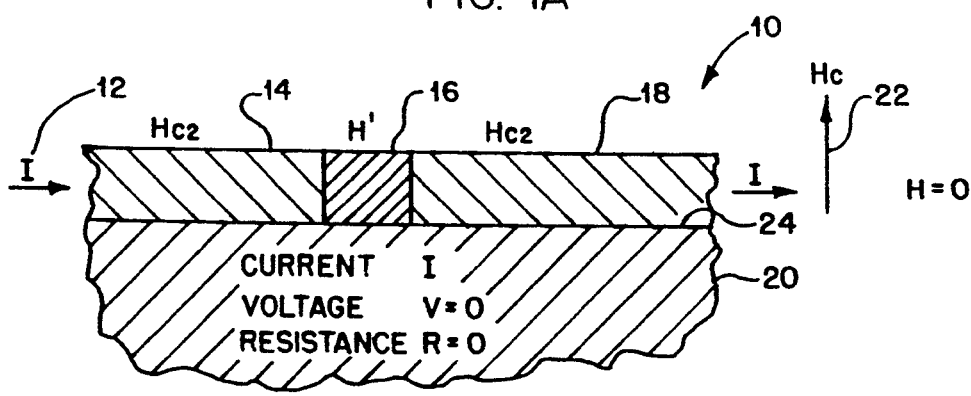
FIGS. 1A, 1B and 1C illustrate by cross-section the different states of the superconductor switch.

Referring to FIG. 1A, a partial section of a circuit is shown of a superconductor switch 10. In the superconducting state a current I 12 flows through the switch 10.

The switch 10 has a first superconductive section 14, a variable resistive section 16, a second superconductive section 18 and a substrate 20 being an electrical insulator.

The switch 10 is composed of therein anisotropic magnetic ceramic superconductor material.

Examples of such ceramic superconductors are Y—Ba—Cu—O, La—Sr—Cu—O, Bi—Sr—Ca—Cu—O, Bi—Pb—Sr—Ca—Cu—O, Tl—Ba—Ca—Cu—O, etc. The substrate 20 may be $SrTiO_3$, $LaAlO_3$, $LaGaO_3$, MgO, $BaTiO_3$, Cubic Zirconia, perouskite/perouskite like materials, Silicon with a buffer layer, etc.

As to the anisotropic field, for example, the upper critical field, $H_{c2}$, has a maximum value in a direction c 22. In switch 10, the sections 14 and 18 are deposited on the substrate 20 such that the upper critical field, $H_{c2}$, is perpendicular to an upper surface 24 of the substrate 20. The variable resistive section 16 is deposited so that the field therein is less than the upper critical field. The value of $H_{c2}$ is of maximum value in one direction and smaller in an orthogonal direction in the anisotropic ceramic superconductor material. The critical field being that field value over which the material becomes non-superconducting.

In the resistive section 16, the material is deposited so that the c-direction of that section is not perpendicular to the substrate surface 24. Thus the upper critical field of section 16 is H' which is smaller than $H_{c2}$. The application of a magnetic field less than H' has no effect on the superconducting states of sections 14, 16 and 18, but a field slightly larger than H' but significantly less than $H_{c2}$ causes the section 16 with different orientation than sections 14 and 18 to become resistive. See FIG. 1C. For thin film having a thickness sufficiently thin this resistance will be sufficiently high to reduce the current to $I_o$ which is much less than I, see FIG. 1C, thus switch 10 becomes an on-off switch controlled by an applied magnetic field.

The external magnetic field may be generated by a current carrying coil and oriented to achieve the effect noted above.

It is clear that the critical fields in sections 14 and 18 should be the same and that the critical field of section 16 should be less.

Figure 1B:
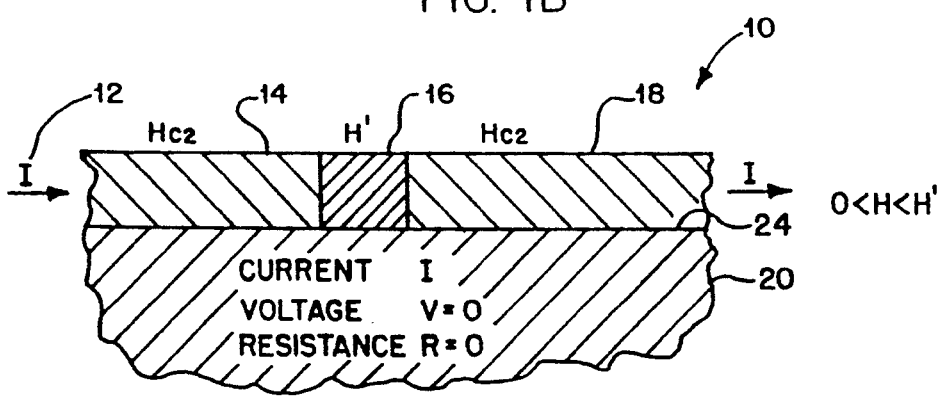
Figure 1C:
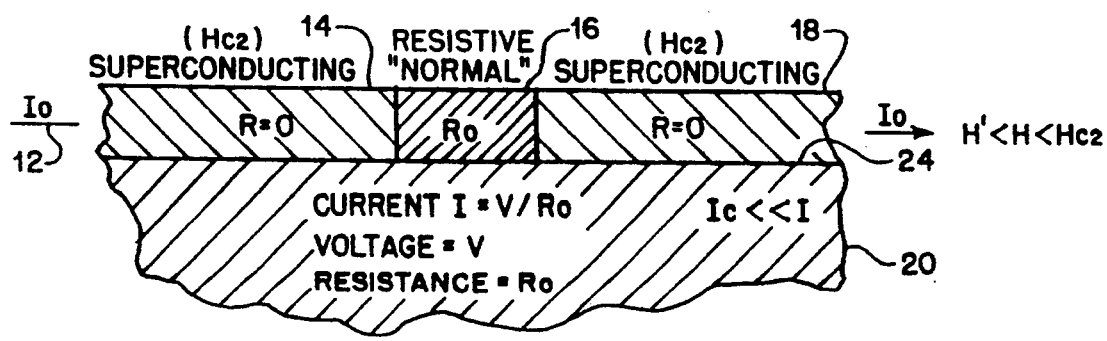

In FIG. 1A, with a zero applied field (H=0) the entire switch 10 is superconducting. In FIG. 1B, the applied magnetic field is less than H' and also $H_{c2}$. In FIG. 1C the applied magnetic field H is greater than H' and less than $H_{c2}$ and thus section 16 becomes resistive.

When section 16 becomes resistive, the current changes from I to $I_o$.

The value of $H_{c2}$ depends on the temperature of the switch 10 and the current density J. H', the critical field of section 16, can be the value in either of the other two crystallographic directions, a combination of the three directions, or that for a polycrystalline region.

Figure 2A:
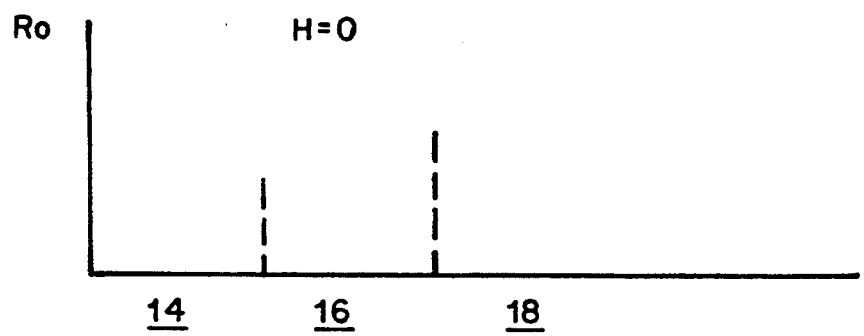
FIGS. 2A, 2B and 2C illustrate the resistance in each section as a function of magnetic field.
Figure 2B:
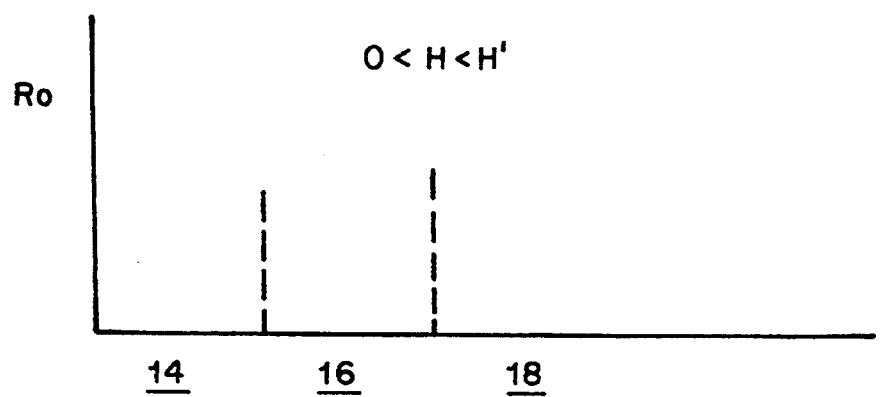
Figure 2C:
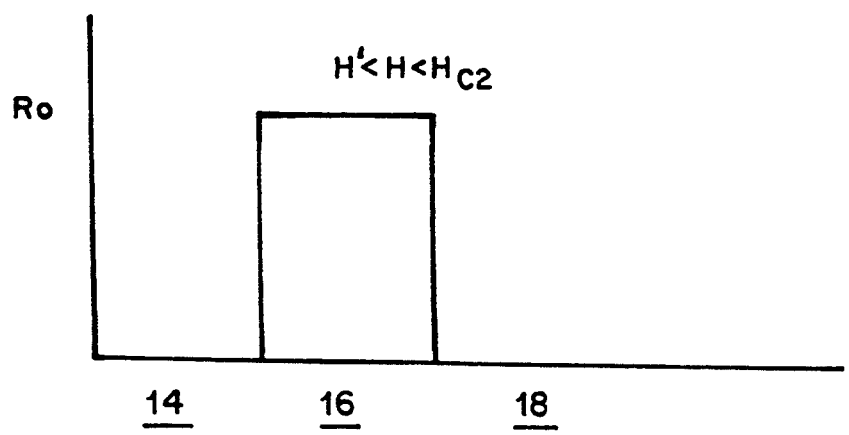

FIGS. 2A, 2B, and 2C illustrate how the resistance changes in the different sections 14, 16 and 18 are a function of the applied magnetic field.

Clearly, many modifications and variations of the present invention are possible in light of the above teachings and it is therefore understood, that within the inventive scope of the inventive concept, the invention may be practiced otherwise than specifically claimed.

What is claimed is:

1. A superconductor switch, said superconductor switch comprising:
   a substrate, said substrate being an electrical insulator and having a substantially flat upper surface;
   means for providing a variable magnetic field, said field having an intensity $|H|$ and a direction $\overline{H}/|H|$;
   a first superconducting section, said first superconducting section fixedly positioned on said substrate, said first superconducting section having a current input end and a current output end, said first superconducting section being composed of a superconducting material having an anisotropic critical magnetic field having a value $H_c$ in the direction $\overline{H}/|H|$
   a second superconducting section, said second superconducting section fixedly positioned on said substrate, said second superconducting section having a current input end and a current output end, said second superconducting section being composed of a superconducting material having an anisotropic critical magnetic field having a value $H_c$ in the direction $\overline{H}/|H|$; and
   a variable resistive section, said variable resistive section fixedly attached on said substrate, said variable resistive section having a current input end and an current output end, the current output end of said first superconducting section attached directly to said current input end of said variable resistive section and the current output end of said variable resistive end being attached directly to said current input end of said second superconductive section, said variable resistive section being composed of a superconducting material having an anisotropic critical magnetic field, said anisotropic critical magnetic field having a value H' in the direction $\overline{H}/|H|$ such that H' is less than $H_c$, said superconductor switch acting as a short when H<H' and an open when $|H|$ is greater than H' and less than $H_c$, said first superconducting section, said variable resistive section and said second superconducting section being a thin film strip and composed of the same material.

2. A superconductor switch as defined in claim 1 wherein said substrate consists of a compound chosen from $SrTiO_3$, $LaAlO_3$, $LaGaO_3$, MgO, $BaTiO_3$ and cubic zirconia.

3. A superconductor switch as defined in claim 1 wherein said superconducting material consists of a compound chosen from Y—Ba—Cu—O, La—Sr—Cu—O, Bi—Sr—Ca—Cu—O, Bi—Pb—Sr—Ca—CuO, and Tl—Ba—Ca—Cu—O.

* * * * *